United States Patent [19]
Sachdev et al.

[11] Patent Number: 5,938,856
[45] Date of Patent: Aug. 17, 1999

[54] PROCESS OF REMOVING FLUX RESIDUE FROM MICROELECTRONIC COMPONENTS

[75] Inventors: Krishna G. Sachdev; Umar M. Ahmad; John U. Knickerbocker, all of Hopewell Junction; Chon C. Lei, Poughkeepsie, all of N.Y.

[73] Assignee: International Business Machines Corporation, Armonk, N.Y.

[21] Appl. No.: 08/876,141

[22] Filed: Jun. 13, 1997

[51] Int. Cl.⁶ ........................................ B08B 7/00
[52] U.S. Cl. ...................... 134/1.3; 134/26; 134/30; 134/38; 134/40
[58] Field of Search .................. 134/38, 40, 42, 134/2, 26, 30, 34, 35, 1.3

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller et al. | 29/626 |
| 4,276,186 | 6/1981 | Bakos et al. | 252/158 |
| 4,438,190 | 3/1984 | Ishimaru et al. | 522/16 |
| 5,112,517 | 5/1992 | Buchwald et al. | 252/171 |
| 5,114,609 | 5/1992 | Buchwald et al. | 134/38 X |
| 5,116,426 | 5/1992 | Asano et al. | 134/40 |
| 5,188,754 | 2/1993 | Weltman et al. | 252/162 |
| 5,246,618 | 9/1993 | Buchwald et al. | 510/177 |
| 5,302,313 | 4/1994 | Asano et al. | 252/171 |
| 5,308,402 | 5/1994 | Bixenman et al. | 134/2 |
| 5,330,582 | 7/1994 | Chihara et al. | 134/40 |
| 5,340,407 | 8/1994 | Bolden et al. | 134/26 |
| 5,395,548 | 3/1995 | Phahl, Jr. et al. | 252/162 |
| 5,401,325 | 3/1995 | Mihelic et al. | 134/39 |
| 5,414,144 | 5/1995 | Watanabe et al. | 568/670 |
| 5,431,739 | 7/1995 | Bengston | 134/2 |
| 5,454,970 | 10/1995 | Flaningman et al. | 252/174.15 |
| 5,482,563 | 1/1996 | Pfahl Jr. et al. | 134/11 |
| 5,482,645 | 1/1996 | Maruyama et al. | 252/170 |
| 5,574,002 | 11/1996 | Shiino et al. | 510/202 |
| 5,612,303 | 3/1997 | Takayanagi et al. | 510/174 |
| 5,628,833 | 5/1997 | McCormack et al. | 134/26 |
| 5,643,818 | 7/1997 | Sachdev et al. | 437/51 |

FOREIGN PATENT DOCUMENTS

WO 93/11280   6/1993   WIPO.

*Primary Examiner*—Jill Warden
*Assistant Examiner*—Alexander Markoff
*Attorney, Agent, or Firm*—DeLio & Peterson, LLC; John J. Tomaszewski; Aziz M. Ahsan

[57] ABSTRACT

This invention relates to the use of non-halogenated and non-aromatic cleaning solvents as environmentally safe replacement of perchloroethylene and xylene to remove rosin flux residue formed on electronic circuit device materials during solder interconnection process for assembly of electronic components.

9 Claims, 1 Drawing Sheet

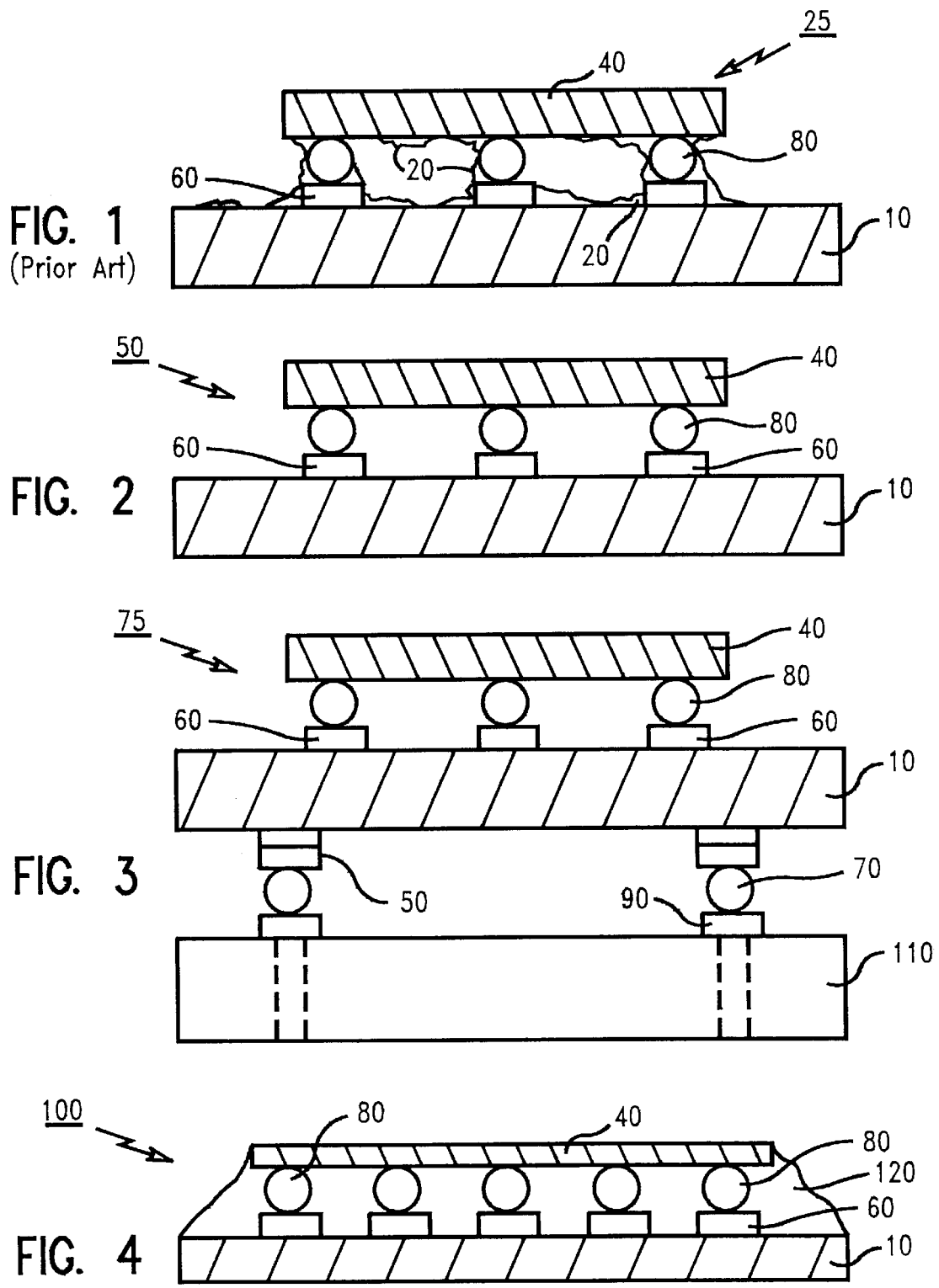

PROCESS OF REMOVING FLUX RESIDUE FROM MICROELECTRONIC COMPONENTS

FIELD OF THE INVENTION

The present invention relates generally to a new process for removing flux and similar other residue from the surfaces of microelectronic components. More particularly, the invention encompasses a solvent cleaning process for cleaning residue, such as, flux, that gets formed on chip, substrate and/or card, using at least one non-halogenated and non-aromatic solvent to remove the residue from the surface of these electronic elements.

BACKGROUND OF THE INVENTION

Semiconductor devices are becoming smaller and more dense with the evolution of new technology. However, increases in circuit density produce a corresponding increase in overall device enhancements in order to remain competitive. Semiconductor manufacturers are therefore constantly challenged to improve the quality, design and other aspects of their products. Whereas significant improvements have been made, however, these improvements alone are not sufficient in meeting all the challenges facing the semiconductor industry.

Assembly processes for electronic circuit devices use solder connections for electrically joining a semiconductor device to a support substrate and for device-substrate package interconnection to organic board. C4 (controlled collapse chip connection) technology, also called flip-chip bonding, is used to attach semiconductor chip to substrate. This involves connecting an array of solder bumps on the chip circuits structure side to module substrate bonding pads by heating the assembly to solder reflow temperature in the presence of solder flux to form a solder bond.

In multilayer ceramic (MLC) products, solder bumps on silicon device are generally of 97Pb/3Sn alloy, i.e., (97%Pb/3%Sn) which are deposited by standard evaporation technique.

However, the chip joining process involves application of a high temperature flux, typically rosin based Alpha-102 on the C4s' and/or on the solder wettable pads on the substrate. The chip having the C4 are aligned to the substrate bonding pads which is further facilitated by the flux viscosity and tackiness. The chip-substrate assembly is then subjected to solder reflow in a furnace under nitrogen or forming gas (5 percent Hydrogen with 95 percent Nitrogen) using a temperature profile with about 350 to about 365° C. peak temperature.

Flip-chip attachment to multi-layer ceramic carrier using solder bumps normally comprise 95%Pb/5%Sn or 97%Pb/3%Sn alloy on the device circuit side are disclosed in U.S. Pat. No. 3,401,126 (Miller) and U.S. Pat. No. 3,429,040 (Miller).

Rosin flux is also used for solder connections using 90Pb/10Sn and eutectic solder (37%Pb/63%Sn) in the fabrication of ball grid arrays (BGAs), ceramic ball grid arrays (CBGA), ceramic column grid arrays (CCGA), SMT discretes, and seal band attachment to provide surface wettability of the contacting surfaces during solder reflow which is essential for solder bond integrity.

In the cooling cycle of the thermal profile for joining, the solder hardens and at the same time the residual flux vapors deposit on the various exposed surfaces. In subsequent step, the electronic assembly is subjected to solvent cleaning operation prior to further processing.

Under the high temperature solder reflow environment, the rosin-flux organics are mostly removed by thermal decomposition to volatile species but a small fraction of these thermally activated species undergoes crosslinking reactions resulting in resinous/carbonaceous by-products as residue on the C4 connections and all other surfaces on the device and the substrate side that are exposed to the volatile species during the solder reflow processing. The flux residue must be removed from all critical surfaces prior to further operation as otherwise it can lead to function failure during long term use due to stress corrosion during exposure to temperature and humidity environment. Therefore, it is necessary that after chip joining and other soldering processes during fabrication of electronic circuit assemblies, the flux residue be cleaned-off before subsequent operations.

Further need for removal of flux residue is dictated by the observation that if any residual film of flux residue remains on the substrate or device surface materials, it causes detriment to the adhesion of C4 epoxy encapsulant or underfill which is required for enhanced C4 fatigue life and C4 reliability during product on-off cycles. After encapsulation, the module assembly is subjected to burn-in and test.

Rosin fluxes are natural products comprising a complex mixture of cyclic hydrocarbon acids and the corresponding esters, alcohols, and decarboxylated products. Among the resin acids which are the major components of the mixture, abietic acid up to between about 50 to about 60 percent, hydroabietic acid, and dehydroabietic acid are the predominant components. These rosin fluxes are known to promote wetting of metal surfaces by their chemically reacting with oxide layer on the surface of tin and/or lead providing oxide-free metal exposed surface of high surface energy which thermodynamically should readily wet clean contacting metal surfaces on the substrate and provide reliable chip-to-substrate interconnection.

However, thermally activated flux species formed during solder reflow also protect the molten solder surface from reoxidation during the reflow process. In this process, abietic acid component of the flux is considered to react with tin or lead to form the corresponding abietate in which metal is bound to organic acid and redeposited on the substrate on cooling.

Rosin-based flux residue cleaning processes traditionally have employed halogenated hydrocarbons, such as, perchloroethylene, 1,1,1-trichloroethane, fluorochlorocarbons CFC-113, and CFC-112, and aromatic hydrocarbons as xylene. The halogenated solvents, however, are undesirable due to their harmful effects on the environment and on human health. Because of the hazards associated with these solvents, particularly perchloroethylene and trichloroethane, their use in industrial processes has become highly restricted in recent years. Specifically, this category of solvents have been identified as Hazardous Air Pollutants or HAP solvents, which are on the OSHA list of Suspected Carcinogens (cancer causing agents), and these are among the SARA Title-III reportable (Superfund Amendment & Re-Authorization Act) compounds that are on the TRI (Toxic Release Inventory) chemicals list.

In addition to these environmental and health hazards, 1,1,1-Trichloroethane like CFCs is also an Ozone Depleting Substance (ODS) that cause stratospheric Ozone depletion and thus it has been phased out while 1,1,2-trichloroethylene has been targeted for phase out by the year 2002. The CFCs are Ozone Depleting Substances use of which is banned in industrial applications. In the case of aromatic hydrocarbons as xylene, there are regulatory issues with its industrial use because it is among the HAP solvents and thus is subject to SARA title-III reporting requirements in addition to its being a VOC (Volatile Organic Compound). VOCs can enter into photochemical reactions with oxides of nitrogen (NOx) in the environment and produce smog which causes health problems. There are also safety concerns with xylene as it is a highly flammable and volatile solvent having flash point 85° F. which requires special high cost equipment for chemical safety in manufacturing environment as well as for compliance with rules for air emissions of hazardous air pollutants.

Because of the environmental concerns and the health hazards associated in the use of halogenated solvents and aromatic hydrocarbons, such as, xylene, in industrial cleaning applications in general, there is currently a major focus on identifying environmentally safe replacements.

Various chemical suppliers and cleaning equipment manufacturers have made available several alternate organic solvents that are relatively safe and mostly exempt from environmental regulations, as well as water-based cleaning solutions and the necessary equipment for alternate organic solvent and water-based cleaning.

U.S. Pat. No. 5,340,407 (Bolden) describes a process of removing soldering flux and/or adhesive tape residue from a substrate. Bolden basically uses terpene-based cleaning compositions for flux residue removal from the surface of a printed circuit board, and also for the removal of the adhesive tape residue.

U.S. Pat. No. 4,276,186 (Bakos) describes a cleaning composition and use thereof. Bakos essentially uses a cleaning composition which includes N-methyl-2-pyrrolidone and an alkanolamine for flux residue cleaning from the surface of printed circuit boards.

Terpene-based microemulsion cleaning solutions such as the ones disclosed in U.S. Pat. No. 5,401,325 (Mihelic), for flux residue cleaning are based on mixture of surfactants, a water soluble glycol ether, a sparingly water-soluble organic solvent, and morpholine in water. These solutions are claimed to be effective in removing baked-on oil and carbon deposits, and oil grease from various electronic device surfaces.

U.S. Pat. No. 5,431,739 (Bengston) discloses a process for cleaning and defluxing parts, specifically electronic circuit assemblies. Bengston provides environmentally safe flux removing compositions, and basically uses aryl alcohols as benzyl alcohol in water as a cleaning medium for solder flux residue from mildly activated rosin flux (RMA), oils and other contaminants from the surface of circuit boards.

U.S. Pat. No. 5,395,548 (Pfahl) and U.S. Pat. No. 5,482,563 (Pfahl) are concerned with defluxing electrical assemblies using non-azeotropic solvent compositions based on combination of fluorinated alcohol and terpene and/or n-methyl-pyrrolidinone (NMP) or a combination of non-halogenated alcohol and terpene.

U.S. Pat. No. 5,112,517 (Buchwald) is concerned with using halogenated hydrocarbons, such as, dichlorodifluoroethanes in conjunction with alkanols for removing resin fluxes and flux residues from printed circuit boards.

None of the references given above are concerned with removal of flux residue formed under-the-chip when rosin flux as Alpha-102 is employed in high temperature solder reflow process for joining a device chip to ceramic-chip-carrier according to C4 technology nor the removal of flux residue from soldering processes in BGA (ball grid array), CBGA (ceramic ball grid arrays, CCGA (ceramic column grid array) attachment to substrate. Moreover, the cleaning compositions employed for the purposes in these patents are based on aqueous alkaline solutions or organic solvents which are not considered suitable for the purpose of this invention due to concern for C4 corrosion and environmental hazard issues with some of the solvents described.

This invention however provides an environmentally safe and effective method for cleaning of rosin-based Alpha-102 flux residue that is formed on the device chip and the substrate surface during solder interconnections by high temperature solder reflow for chip attachment according to Controlled Collapse Chip Connections (C4) technology in multi-layer ceramic products, and for flux residue cleaning after solder joining processes for electronic package to substrate interconnections. In C4 joining of devices having quartz or polyimide terminal passivation layer, the critical surfaces that are exposed to flux residue contamination during reflow are: Pb/Sn solder connections; bonding metallurgy on the substrate side; substrate ceramic; and polyimide passivation layer on the device chip. Standard processes for under-the-chip flux residue removal subsequent to chip joining are based on perchloroethylene or aromatic hydrocarbons, typically xylene, both of which are hazardous solvents. The inventors have discovered a group of non-hazardous solvents for effective removal of rosin flux residue from various critical surfaces effected during high temperature solder reflow interconnection processes to provide superior replacement of environmentally hazardous perchloroethylene, 1,1,1-trichloroethane, xylene and related halogenated and aromatic hydrocarbon solvents.

The flux residue cleaning solvents according to this invention are characterized by the presence of two or more functional groups of varying polarity, specifically, —OH and —COOR; —OR and —COOR; —OR and OCOR; and —OH and —OR, where R is a hydrocarbon group $C_nH_{2n+1}$ with n=1–4. Representative solvents with these features are: lactate esters as ethyl lactate, butyl lactate; alkoxyesters as ethyl-3-ethoxypropionate; alkoxyacetates as propylene glycol methylether acetate, propylene glycol methylether propionate (Methotate), propylene glycol butylether, dipropylene glycol methylether, dipropylene glycol methylether acetate.

Unlike halogenated hydrocarbon solvents and aromatic hydrocarbons, the replacement solvents according to this invention have no environmental regulatory issues, have no problem of toxic air emissions or health hazards, and are generally Class II or Class III combustibles (flash point greater than about 100° F.) which offers a significant advantage in terms of equipment requirement over xylene which is highly flammable.

PURPOSES AND SUMMARY OF THE INVENTION

It is a purpose of this invention to provide an environmentally safe method for effective removal of rosin-based flux residue formed during high temperature solder reflow in electronic component assembly processes.

Another purpose of this invention is to provide an environmentally safe method for cleaning under-the-chip flux residue formed during solder reflow process for flip-chip attachment to ceramic chip carrier.

Another purpose of this invention is to provide safe organic solvents for flux residue cleaning from metal and ceramic surfaces exposed during thermal processes for solder balls and solder columns attachment to substrate.

Still another purpose of this invention is to provide environmentally safe alternatives to chlorinated solvents and aromatic hydrocarbons in flux residue cleaning by using lactate esters; alkoxyesters as ethyl-3-ethoxy propionate; propylene glycolether acetate; propylene glycolether propionate.

It is also a purpose of this invention to provide a method for cleaning rosin flux residue using non-hazardous solvents which are free of environmental regulations for chlorinated solvents and for xylene type solvents.

Another purpose of this invention is to provide a replacement for chlorinated solvent-based cleaning of flux residue that is free of toxic air emissions and hazardous waste disposal cost issues.

Yet another purpose of this invention is to provide a non-hazardous cleaning process for removal of flux residue from under-the-chip which has no detrimental effect on the various contacting surfaces including solder connections, ceramic chip carrier and binding metallurgy thereto, and the polyimide passivation on the device.

Still yet another purpose of this invention is to provide an environmentally safe cleaning process for removal of flux residue from under-the-chip to obtain organic contamination-free surfaces necessary for adhesion and interface integrity of C4 epoxy encapsulation in subsequent operation for enhancement of C4 fatigue life.

Another purpose of this invention is to provide a simplified cost effective method for cleaning rosin flux residue using non-hazardous organic solvents.

Therefore, in one aspect this invention comprises a solvent cleaning process for cleaning residue from at least one surface of a semiconductor element wherein said solvent is at least one non-halogenated and non-aromatic solvent.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIG. 1 illustrates a cross-sectional view of a prior art semiconductor device that has been joined using the processes of the prior art and which also shows the residual flux residue on the surfaces.

FIG. 2 illustrates a cross-sectional view of the semiconductor device of FIG. 1, after the removal of the flux residue using the solvent and the solvent cleaning process according to this invention.

FIG. 3 illustrates another embodiment of this invention showing a plurality of semiconductor devices that have been joined and their residual flux residue have been removed using the solvent and the solvent cleaning process according to this invention.

FIG. 4 is a cross-sectional view of the semiconductor device of FIG. 2, after the areas cleaned according to this invention have been protected.

DETAILED DESCRIPTION OF THE INVENTION

This invention generally relates to bond and assembly processes in microelectronics involving semiconductor device joining to insulative substrate or chip carrier, and substrate-to-board interconnections in the fabrication of multi-chip-module (MCM) and single-chip-module (SCM). However, this invention particularly relates to the removal of flux residue that is formed with rosin-based flux under high temperature solder reflow conditions which are normally used for connecting semiconductor chip to ceramic support substrate. The invention is also concerned with removal of flux residue formed in other types of solder interconnections, such as, for example, electronic package-to-board, SMT discretes, seal band attachment, to name a few. More particularly, this invention is concerned with cleaning of flux residue from under-the-chip after C4 (Controlled Collapse Chip Connection) chip joining with environmentally safe organic solvents, which are to replace halogenated solvents and aromatic hydrocarbons particularly, perchloroethylene, chlorofluorocarbons, and xylene, which solvents are hazardous to human health and to the environment.

FIG. 1, is an illustration of an interconnection structure 25, where an integrated semiconductor device or chip 40, has been joined to a chip carrier or substrate 10, using at least one solder ball 80, such as, a C4, on at least one pad 60. FIG. 1, also shows a flux residue 20, on the underside of a chip 40, on the solder ball connections 80, on the surface of the ceramic substrate 10, and on the side walls of the bond pads 60. These flux residue 20, must be removed for a variety of reason, such as, to be able to pass inspection, to avoid any shorts, to trap other undesirable materials, to name a few.

FIG. 2, shows an interconnection structure 50, which is similar to the interconnection structure 25, except that the flux residue 20, from FIG. 1, has been removed using solvent cleaning according to this invention, and that the interconnection structure 50, is now ready for further processing. As one can clearly see that in FIG. 2, there is no residual flux residue 20, on the underside of the chip 40, or on the solder ball connection 80, or on the surface of the ceramic substrate 10, or on the side walls of the bond pads 60.

FIG. 3, is an illustration of an interconnection structure 75, that comprises of a flip-chip 40, that is electrically joined to the ceramic substrate 10, using at least one solder bump connection 80, and the substrate bonding pads 60. The substrate 10, is then joined to a card 110, such as, an organic card 110, through at least one solder ball connection 70, and substrate bond pads 50, to the bond pads 90, on the card 110. The flux residue 20, that is formed after the soldering process, has been shown to have been removed from all the surfaces by the solvent cleaning process and materials according to this invention.

FIG. 4, is a cross-sectional view of an interconnection structure 100, comprising the semiconductor device 50, of FIG. 2, after the flux residue areas have been cleaned according to this invention have been protected using at least one protective material 120, such as, for example, EPX 120, to name a few.

In the fabrication of microelectronic devices, soldering processes for interconnections are an integral part of assembly for electrically joining semiconductor device to a substrate, and for attachment of solder balls and solder columns to the substrate BSM (back side metal). In the controlled collapse chip connection (C4) or flip-chip technology that employs solder bumps on silicon chip circuit side for connecting to ceramic chip carrier, a high temperature flux, typically rosin-based Alpha-102 is applied on C4s' and/or solder wettable metal pads on the substrate prior to assembling/aligning and then the assembly is subjected to solder reflow process in a programmed furnace in oxygen-free ambient of $N_2$ or forming gas (5%$H_2$+95%$N_2$). The peak temperature used in solder reflow profile depends on the Pb/Sn alloy composition used for chip attachment. With 90%Pb/10%Sn, and 97%Pb/3%Sn alloy, peak temperature in the reflow process generally can reach 360° C.

With eutectic solder 37Pb/63Sn composition, such as, used for BGA join, wire column join, SMT discrete attachment, and seal band attachment, the peak temperature during interconnections may be between about 215 to about 225° C.

Under these solder reflow conditions, the rosin flux promotes wetting of metal surface necessary to metal-metal contact and bonding, and itself undergoes thermally induced chemical changes that lead to formation of volatile species most of which are readily removed during the process but some of these reactive species undergo secondary crosslinking reaction resulting in deposition of carbonaceous residue on critical surfaces. It is necessary that the flux residue be cleaned prior to subsequent operations as its presence can interfere with the adhesion of C4 encapsulant, and can be a source of corrosion when subjected to temperature and humidity environment causing product reliability problems. As stated earlier, traditionally used solvents for cleaning flux residue on critical surfaces in the chip joining process and on circuit board assemblies where flux is used to ensure uniform bonding of solder for durable adhesion of board components are typically chlorinated solvents, CFCs, and aromatic hydrocarbons which all have environmental issues and health hazards and thus their use has become highly restricted and some of these have been banned for use in industrial cleaning processes.

According to this invention, the organic solvent alternatives to halogenated solvents and xylene for removal of rosin flux residue should be non-hazardous and free of environmental regulatory issues, have high flash point, and should provide effective cleaning of flux residue from all critical surfaces under-the-chip in solder reflow process for C4 chip joining on multilayer ceramic and thin film glass ceramic and capacitor attachment to substrate. Various organic solvents for flux residue cleaning according to this invention should also be effective in removing flux residue formed in 37%Pb/63%Sn eutectic solder reflow at peak temperature in the range from about 210 to about 225° C., for example, BGA (ball grid array) join, solder column attachment, SMT (surface mount) discretes (capacitors and resistors) and seal band attachment.

The inventors have unexpectedly found that rosin flux residue formed in high temperature solder reflow processes for attachment of semiconductor chips and other component assembly, can be effectively cleaned with solvents selected from the group of alpha-hydroxy esters as lactate esters, alkoxyesters as ethyl-3-ethoxy propionate (EEP); and propylene glycol alkylether acetate or propionate. It is also found that Oxsol solvents (trade name of OxyChem corp.), specifically Oxsol 10 (chlorotoluene) and Oxsol 100 (p-chlorobenzotrifluoride) provide efficient removal of rosin flux residue. Preferred solvent candidates for flux residue cleaning according to this invention not among the hazardous air pollutants (HAPs), nor the SARA title-III reportable compounds, nor among the suspected carcinogens. These candidates are classified as Combustible solvents in Class II or Class III category having flash point greater than about 100° F. and are not among the flammable category. Representative solvent candidates having these characteristics with flash point (°F.) are: ethyl lactate (139° F.); butyl lactate (170° F.); ethyl-3-ethoxypropionate (136° F.); propylene glycol methylether acetate (115° F.); propylene glycol methylether propionate or Methotate (133–135° F.); dipropylene glycol methyl ether (166–167° F.); dipropylene glycol methyl ether acetate (186–187° F.). Surface tension of these solvents that have been found effective in post chip-join rosin flux residue is typically in the range 27–32 dynes/cm.

To determine the relative effectiveness of these solvents in terms of degree of cleaning flux residue from various surfaces, chip reflow simulation using rosin flux Alpha-102 was carried out with all relevant surfaces and these surfaces were analyzed by ESCA (Electron Spectroscopy for Chemical Analysis or XPS: X-ray photoelectron spectroscopy) after cleaning the residue according to this invention. XPS is a highly sensitive technique for surface analysis that provides elemental identification, quantitative determination of surface elemental composition, and for information on oxidation states, nature of chemical bonding, and substituent chemical effects. The technique involves excitation of core electrons of surface atoms with a monochromatized beam of soft X-rays and determination of electron binding energies (BE) by measuring the kinetic energies (KE) of the emitted electrons from a given atomic orbital. The kinetic energy is given by the relationship:

$$KE = h\nu - BE - \phi$$

where $\phi$ is the correlation factor for the spectrometer work function. The binding energies are characteristic of the atomic orbital and are modified by the chemical/electronic environment of the elements in the surface structure while the number of photoelectrons emitted is a direct measure of the number of atoms of those elements in the surface layer which forms the basis for XPS analysis in surface studies. Details of electron spectroscopy including XPS theory and applications can be found in several books that are available, eg., "Practical Surface Analysis by Auger and X-Ray Photoelectron Spectroscopy", Wiley, N.Y., 1983 (Eds., D. Briggs and M. P. Seah); "Electron Spectroscopy—Theory, Technique and Applications," Vol. 4, Academic Press, London, 1981 (Eds. C. Brundle and A. D. Baker).

In representative simulation experiments for the flux residue on relevant surfaces, rosin flux alpha-102 was applied onto ceramic substrate with I/O pads having Mo/Ni/Au surface with Au as the top surface, evaporated and plated 97%Pb/3%Sn, and PMDA-ODA polyimide (cured product of pyromellic dianhydride-oxydianiline polyamic acid) which is a commonly used insulator for terminal via passivation on the device chip. The fluxed parts were subjected to chip join simulation using standard solder reflow furnace profile and cooled to room temperature before removing from the furnace. For reference purposes, all surfaces were analyzed by ESCA before and after subjecting to thermal reflow conditions. Rosin flux residue carrying parts were then cleaned according to the method of this invention and all surfaces were analyzed again by ESCA to determine the surface chemical composition in each case.

In a representative process for flux residue cleaning, parts carrying residue on selected surfaces were separately immersed in the solvent at between about 60 to about 90° C. for between about 5 to about 15 minutes under constant agitation, followed by 2–4 minute rinse with 2-propanol to replace the higher boiling cleaning solvent so as to accelerate drying by blowing nitrogen in subsequent operation. Removal of the residue can be accelerated by continuous solvent flow or spray under pressure or ultrasonic spray. After solvent cleaning, the parts were dried at between about 90 to about 100° C. under $N_2$ and allowed to cool in inert ambient. ESCA analysis of cleaned surfaces provided surface elemental composition in each case which was compared with the corresponding surface prior to solvent cleaning and thus the degree of cleaning achieved with various solvents. Based on the ESCA data, efficient and effective removal of flux residue from ceramic, Au, Pb/Sn solder, and polyimide is obtained with ethyl lactate and butyl lactate, ethyl-3-ethoxypropionate, and with propylene glycol methylether propionate with no corrosion of Pb/Sn or other detrimental effect on any of the surfaces examined. It is also found that continuous flow of hot solvent spray and ultrasonic spray accelerates the cleaning and provides more effective removal of residue, especially for post chip join flux residue cleaning, from under-the-chip but it is not necessarily required for the desired cleaning of residue on directly exposed surfaces as in the soldering process for BGAs, CBGAs, and CCGAs, etc.

Since ESCA analysis is limited to surfaces which are directly accessible or exposed to electron impact, to determine the effectiveness of this solvent cleaning method in removal of under-the-chip flux residue, a technique based on solvent extraction and spectrophotometric analysis of the extract was used. Flip-chip attachment to ceramic module using rosin flux Alpha-102 was obtained by standard C4 process involving solder reflow furnace profile and the assembled parts were cleaned with ethyl-3-ethoxypropionate (EEP), ethyl lactate and butyl lactate as described above for simulated processing on various surfaces. The cleaned chip joined parts were subjected to solvent extraction to extract out any residual soluble fraction of the residue and the extract was analyzed by UV spectroscopy. These measurements showed that with EEP solvent cleaning, no extractable residue remains under-the-chip while with ethyl lactate cleaning, the extractable residue showed variable results ranging from zero to 10–14 $\mu g/cm^2$.

Further confirmation of these results was obtained by subsequent C4 encapsulation with EPX, an epoxy resin when it was found that the EEP cleaned parts had void-free epoxy coating on C4s evidenced by the Sonoscan pictures while the ethyl lactate cleaned parts had variability in the void level from no voids to a few voids which corresponds to the variability in solvent extraction results.

This solvent cleaning process using non-halogenated and non-aromatic solvent provides an effective removal of flux residue on ceramic, Au, Pb/Sn, and polyimide surfaces. The non-halogenated and non-aromatic solvent is preferably ethyl-3-ethoxy propionate; ethyl lactate; butyl lactate; propyleneglycol methylether propionate, and combination thereof.

The removal of the flux residue from the surfaces of the semiconductor element can also be quantitatively determined, such as, by doing X-ray Photoelectron Spectroscopy analysis before and after solder flux reflow process. It has been found that the solvent cleaning process of this invention provides complete removal of flux residue from under-the-chip even after the C4 chip loin reflow process. The removal of the flux residue from the semiconductor element can also be determined by subjecting the solvent cleaned parts to multiple solvent extraction process using a range of solvents from highly polar to highly non-polar, and measuring UV absorption of the extract.

The removal of the flux residue can also be determined by the extent of voids in the C4 encapsulation with an epoxy underfill after cleaning with the non-halogenated and non-aromatic solvent, this can be done, such as, by using Sonoscan profile of the encapsulated assembly.

EXAMPLES

Various aspects of the present invention are further illustrated by referring to the following examples which are intended only to further illustrate the invention and are not intended to limit the scope of the invention in any manner.

EXAMPLE 1

As a simulation of the solder reflow process for chip joining, rosin based flux Alpha-102 for the solder joining was applied on the following surfaces and the parts were subjected to standard chip reflow furnace profile resulting in flux residue formation on these surfaces:
(a) ceramic substrate having an array of input/output (I/O) pads with Au on the top surface,
(b) plated and evaporated Pb/Sn deposit on device wafer,
(c) cured PMDA-ODA polyimide film on silicon wafer.

The parts were cleaned within 24 hrs of residue deposition by immersion with efficient agitation in ethyl lactate; butyl lactate (trade name-Purasolv); ethyl-3-ethoxy propionate (EEP)); and propyleneglycol methylether acetate; propyleneglycol methylether propionate (trade name Methotate) at 60–90° C. for 10 min followed by 2–4 min rinse in 2-propanol and blow drying with Nitrogen. The cleaned parts were dried at 100° C. for 30 minutes, allowed to cool down to room temperature in nitrogen atmosphere and the surfaces were analyzed by ESCA. In addition, as-deposited flux residue carrying surfaces prior to cleaning and the ones cleaned with perchloroethylene and xylene/benzyl alcohol mixture were analyzed for comparison of the data with the cleaned surfaces according to the method of this invention. Following ESCA data showing surface composition of the elements detected on various surfaces are representative:
(a) Solvent cleaning effectiveness of rosin flux residue on ceramic:

Ceramic substrates carrying flux residue from simulated chip join solder reflow profile were cleaned with the environmentally safe solvents as described above and the cleaned surfaces were analyzed by ESCA. Following data shows the results of residue cleaning according to this invention in comparison to cleaning with perchloroethylene and with xylene-based solvent:

| Solvent | Alumina Ceramic Surface ESCA Elemental Composition, Atom Percent | | | |
| --- | --- | --- | --- | --- |
| | C (1s) | O (1s) | Al (2p) | Si (2p) |
| Not cleaned | 90 | 10 | — | — |
| Ethyl Lactate | 38 | 37 | 25 | 3 |
| EEP[1] | 31 | 39 | 25 | 3 |
| Butyl Lactate | 42 | 37 | 21 | — |
| PMA[2] | 59 | 23 | 14 | — |
| PCE[3] | 39 | 37 | 24 | — |
| BzOH[4]/Xylene | 34 | 37 | 25 | 4 |

[1]EEP = Ethyl-3 Ethoxypropionate
[2]PMA = Propylene glycol methyl ether acetate
[3]PCE = Perchloroethylene
[4]BzOH = Benzyl Alcohol According to these data, prior to solvent cleaning, the carbonaceous layer entirely covers the surface of ceramic indicating that the thickness of the flux residue layer on the surface of ceramic may be greater than 100 Å from consideration of the escape depth of ESCA electrons. The Al, Si, and oxygen signals from the ceramic underneath are completely masked by the overlying residue. Comparison of the surface elemental composition after cleaning with various solvents shows that ethyl-3-ethoxypropionate (EEP) is most effective while ethyl lactate, butyl lactate, and propyleneglycol methylether propionate also provide effective cleaning of flux residue on most surfaces. The data show that cleaning effectiveness with these alternate solvents is similar to cleaning with perchloroethylene and with xylene/benzylalcohol mixture. Other solvents in the category as propyleneglycol methylether acetate, isopropyl lactate, n-butyl acetate, and Oxsol 10 (chlorotoluene) were found to be less effective in residue removal.

(b) Substrate Cleaning after Solder Ball Attachment

According to a standard process for solder ball attachment, spherical solder balls are mechanically placed on an array of holes with a carrier which has identical array of pick-up nozzles. In this process, flux is used on the substrate to hold the solder balls in place and the substrate is heated to solder reflow temperature to form solder balls interconnection with terminal pads. In this process, flux residue is generally formed on the solder surface which is removed by solvent cleaning as otherwise it can cause temperature and humidity induced corrosion and function failure. After the solder ball attachment, the substrates ware cleaned with environmentally safe solvents according to this invention as described above. Surface chemistry of solvent cleaned surfaces was compared with corresponding surfaces after solder ball attachment and cleaning with perchloroethylene and with xylene/benzyl alcohol. Following ESCA data are representative:

Pb/Sn Surface After Solvent Cleaning
ESCA Elemental Composition, Atom percent

| Solvent | C (1s) | O (1s) | Pb (4f7) | Sn (3d) |
| --- | --- | --- | --- | --- |
| No cleaning | 90 | 10 | — | — |
| EEP[1] | 51 | 33 | 7 | 10 |
| PCE[2] | 45 | 36 | 6 | 12 |
| Xylene/BzOH[3] | 65 | 27 | 3 | 6 |

[1]EEP = Ethyl-3 Ethoxypropionate
[2]PCE = Perchloroethylene
[3]BzOH = Benzyl Alcohol As evident from these data, performance of EEP (ethyl-3-ethoxypropionate) as a flux residue cleaning solvent is similar to that of perchloroethylene while in the case of xylene/benzyl alcohol, significant level of carbon containing species indicative of organic residue still remaining after cleaning. ESCA analysis of solder surface after cleaning the residue with Ethyl lactate, butyl lactate, propylene glycol methylether propionate, and propylene methylether acetate showed somewhat higher level of residual carbon in comparison to ethyl-3-ethoxy propionate.

(c) Substrate I/O Pads Surface Analysis After Cleaning:

Ceramic substrates having Mo/Ni/Au I/O pads were fluxed with rosin flux Alpha-102 on the I/O pads side and subjected to standard solder reflow furnace profile. The resulting flux residue on the surface was cleaned with different solvents which are: ethyl-3-ethoxypropionate (EEP), ethyl lactate and butyl lactate. ESCA analysis of cleaned surfaces showed carbon in the range 55–62 percent; oxygen 29–34 percent; Au 6–10 percent; and Ni about 2 percent. In comparison, analysis of xylene cleaned I/O pads showed considerably higher percentage of carbon, about 80 percent and only 2 percent Au signal. Some of the carbon detected on the metal surface may be due to adventitious carbon caused by environmental contamination which is commonly observed when activated metal surfaces are exposed to non-clean room environment.

(d) Polyimide Surface After Solvent Cleaning Of Residue

Simulated flux residue on cured PMDA-ODA polyimide film on silicon wafer was cleaned using EEP and ethyl lactate solvents according to the process described above. After drying at 100° C. for 30–45 min, polyimide surface was analyzed by ESCA. The surface chemical composition was found to be consistent with the polyimide surface chemistry with increased oxygen carrying species and small percentage of extraneous carbon. These surface characteristics are typical of polyimide surfaces exposed to high temperature and solvent processes which cause monolayer chemical changes in polyimide structure in the surface region.

EXAMPLE 2

Solvent Extraction Of Chip-Joined Parts After Flux Residue Cleaning:

According to a standard chip joining process, rosin flux is applied on the C4s and/or the C4 pads of the ceramic substrate, the components are assembled and subjected to high temperature chip reflow profile up to 360–365° C. After chip joining, parts were cleaned with ethyl-3-ethoxypropionate (EEP) and with ethyl lactate, and dried at 100° C. For comparison, similarly chip joined parts were cleaned according to a xylene-based cleaning process commonly used in C4 assembly. Subsequent to residue cleaning, all parts were subjected to solvent extraction using combination of polar and non-polar solvents to extract out any remaining flux residue. The extract was analyzed by spectrophotometric analysis to determine the extent of residue remaining on the assembly after solvent cleaning. The data showed that effectiveness of cleaning with ethyl-3-ethoxypropionate is similar to the standard xylene-based cleaning process showing no detectable absorption attributable to rosin residue in both cases.

In a similar solvent extraction process, chip joined parts were subjected to residual organics removal with ethyl lactate cleaning, and the extract was analyzed spectrophotometrically. It was found that with multiple samples, results varied from no detectable absorption indicative of zero residual extractable organics to absorption signal intensity corresponding to 10–14 $\mu g/cm^2$ as the residue extracted.

EXAMPLE 3

Subsequent to flux residue cleaning with ethyl-3-ethoxypropionate and with ethyl lactate as described in Example 2, EPX, an epoxy resin, was dispensed on the C4 pad region under the chip and thermally cured to provide C4 encapsulation. Sonoscan pictures to determine the integrity of the C4/encapsulant interface showed void-free epoxy coating on C4s for the EEP cleaned parts while the ethyl lactate cleaned parts showed variability in the void level from no voids to a few voids which corresponds to the variability in solvent extraction results.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A solvent cleaning process for cleaning rosin-based flux residue from at least one surface of a semiconductor element which residue is formed under high temperature above about 210° C. solder reflow conditions comprising contacting the residue containing semiconductor element with a cleaning solvent composition consisting essentially of at least one alkoxy propionic acid ester having functional groups —OR and —COOR; wherein R is a hydrocarbon radical consisting of a group, $C_nH_{2n+1}$ with n=1–4.

2. The solvent cleaning process of claim 1, wherein said at least one alkoxy propionic acid ester is ethyl-3-ethoxypropionate.

3. The solvent cleaning process of claim 1, further comprising steps of subjecting said surface residue containing semiconductor element to said solvent composition at between about 60 to about 80° C., stirring and/or agitating the solvent composition with constant solvent flow under pressure or with ultrasonic spray for between about 5 to about 15 minutes, rinsing with at least one solvent having a lower boiling point than the flux residue cleaning solvent composition, and drying.

4. The solvent cleaning process of claim 3, wherein said residue containing semiconductor element is a chip C4 bonded to a chip carrier and wherein said at least one alkoxy propionic acid ester is ethyl-3-ethoxypropionate.

5. The solvent cleaning process of claim 1, further comprising steps of subjecting said residue carrying semiconductor element to said solvent in a pressure spray or ultrasonic spray from at a temperature of between about 60 to about 90° C., for between about 5 to about 15 minutes, rinsing with at least one lower boiling solvent, and drying.

6. The solvent cleaning process of claim 5, wherein said residue containing semiconductor element is a chip C4 bonded to a chip carrier and wherein said at least one alkoxy propionic acid ester is ethyl-3-ethoxypropionate.

7. The solvent cleaning process of claim 1, wherein said surface is selected from a group consisting of ceramic surface, metal surface, solder ball surface, and polyimide dielectric surface.

8. The solvent cleaning process of claim 1, wherein said semiconductor element is selected from the group consisting of solder ball, C4, chip, semiconductor substrate, electronic assembly of chip secured to semiconductor substrate, ball grid arrays, column grid arrays, and surface mount assembly.

9. The solvent cleaning process of claim 1, wherein said at least one alkoxy propionic acid ester is among Class II or Class III combustible category having flash point of grater than about 100° C.

* * * * *